(12) United States Patent
Mills et al.

(10) Patent No.: US 9,374,925 B2
(45) Date of Patent: Jun. 21, 2016

(54) POWER MODULE

(71) Applicant: Labinal, LLC, Denton, TX (US)

(72) Inventors: Patrick Wellington Mills, Bradenton, FL (US); James Michael McCormick, Bradenton, FL (US); David Michael Geier, Punta Gorda, FL (US)

(73) Assignee: Labinal, LLC, Denton, TX (US)

( * ) Notice: Subject to any disclaimer, the term of this patent is extended or adjusted under 35 U.S.C. 154(b) by 44 days.

(21) Appl. No.: 14/464,848

(22) Filed: Aug. 21, 2014

(65) Prior Publication Data
US 2015/0062830 A1    Mar. 5, 2015

Related U.S. Application Data

(60) Provisional application No. 61/870,420, filed on Aug. 27, 2013.

(51) Int. Cl.
*H05K 7/00* (2006.01)
*H05K 7/14* (2006.01)

(52) U.S. Cl.
CPC .................................. *H05K 7/1457* (2013.01)

(58) Field of Classification Search
CPC ........................... H05K 7/1457; H05K 7/1432
USPC ......... 361/601, 602, 622, 625–630, 634, 636, 361/641, 647, 652, 673, 728, 729, 730, 735, 361/826
See application file for complete search history.

(56) References Cited

U.S. PATENT DOCUMENTS

| | | | |
|---|---|---|---|
| 3,711,626 A | 1/1973 | Kilby | |
| 5,673,985 A | 10/1997 | Mitchell | |
| 6,069,797 A | 5/2000 | Widmayer et al. | |
| 6,504,730 B1 | 1/2003 | Cooney et al. | |
| 6,704,181 B2 | 3/2004 | Saksa | |
| 6,791,211 B1 * | 9/2004 | Flegel | H01H 73/08 307/113 |
| 6,905,372 B2 * | 6/2005 | Cabrera | H05K 7/1457 361/641 |

(Continued)

OTHER PUBLICATIONS

International Search Report filed in PCT/US 2014/51999 mailed Nov. 26, 2014.

(Continued)

*Primary Examiner* — Hoa C Nguyen
*Assistant Examiner* — Sagar Shrestha
(74) *Attorney, Agent, or Firm* — Rankin, Hill & Clark LLP

(57) ABSTRACT

A power module is provided. The power module includes a housing assembly and an electrical assembly. The electrical assembly includes an AC input assembly, a DC input assembly, a number of AC feeder layers, a number of DC feeder layers, a number of AC electrical components and a number of DC electrical components. Each AC feeder layer includes a generally planar body and an embedded conductor. Each DC feeder layer includes a generally planar body and an embedded conductor. Each AC feeder layer conductor is coupled to, and in electrical communication with, said AC input assembly. Each DC feeder layer conductor is coupled to, and in electrical communication with, said DC input assembly. Each AC electrical component is coupled to, and in electrical communication with, an AC feeder layer conductor. And, each DC electrical component is coupled to, and in electrical communication with, a DC feeder layer conductor.

18 Claims, 9 Drawing Sheets

(56) References Cited

U.S. PATENT DOCUMENTS

| | | |
|---|---|---|
| 2005/0024842 A1 | 2/2005 | Warenczak |
| 2007/0188954 A1* | 8/2007 | Wiese .................... H02H 3/006 361/62 |
| 2007/0258219 A1* | 11/2007 | Howes ................. H05K 7/1432 361/728 |
| 2011/0235244 A1 | 9/2011 | Mills |
| 2012/0262848 A1* | 10/2012 | Mills ..................... H02B 1/056 361/636 |
| 2013/0050906 A1* | 2/2013 | Peplinski ................ H02B 1/32 361/622 |
| 2013/0322016 A1* | 12/2013 | Jones ................... H05K 7/1432 361/689 |
| 2014/0098498 A1* | 4/2014 | Huang ................ H05K 7/1432 361/720 |
| 2014/0185195 A1* | 7/2014 | Samuelson ............ H02B 1/056 361/634 |

OTHER PUBLICATIONS

International Search Report filed in PCT/US2014/064062 mailed Feb. 18, 2015.

* cited by examiner

POWER MODULE

BACKGROUND OF THE INVENTION

1. Field of the Invention

The disclosed and claimed concept relates to power modules for aircraft and, more specifically, to a power module including a number of feeder layers with embedded conductors and conductive coupling components.

2. Background Information

Power modules for aircraft, such as, but not limited to, a power module including a number of circuit breakers, should be small and robust. Known power modules utilize point to point wiring. There are disadvantages to this configuration. For example, wiring occupies space and increases the volume required for the power module. Further, wiring vibrates causing the wires to rub against each other and wear. It also takes time to assemble a power module that utilizes wires as each wire must be attached individually. Further, power modules are generally made from lighter materials. These materials, however, tend to be less robust and the power module cannot act as a load bearing element.

There is therefore a need for a power module that occupies a smaller volume than known power modules. There is a further need for a power module that is more robust than known power modules.

SUMMARY OF THE INVENTION

These needs, and others, are met by at least one embodiment of this invention which provides a power module utilizing a number of feeder layers. In an exemplary embodiment, the power module includes a housing assembly and an electrical assembly. The housing assembly defines an enclosed space. The electrical assembly includes an AC input assembly, a DC input assembly, a number of AC feeder layers, a number of DC feeder layers, a number of AC electrical components and a number of DC electrical components. Each AC feeder layer includes a generally planar body and an embedded conductor. Each DC feeder layer includes a generally planar body and an embedded conductor. Each AC feeder layer conductor is coupled to, and in electrical communication with, said AC input assembly. Each DC feeder layer conductor is coupled to, and in electrical communication with, said DC input assembly. Each AC electrical component is coupled to, and in electrical communication with, an AC feeder layer conductor. And, each DC electrical component is coupled to, and in electrical communication with, a DC feeder layer conductor. Further, the power module housing assembly is a load bearing unit.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
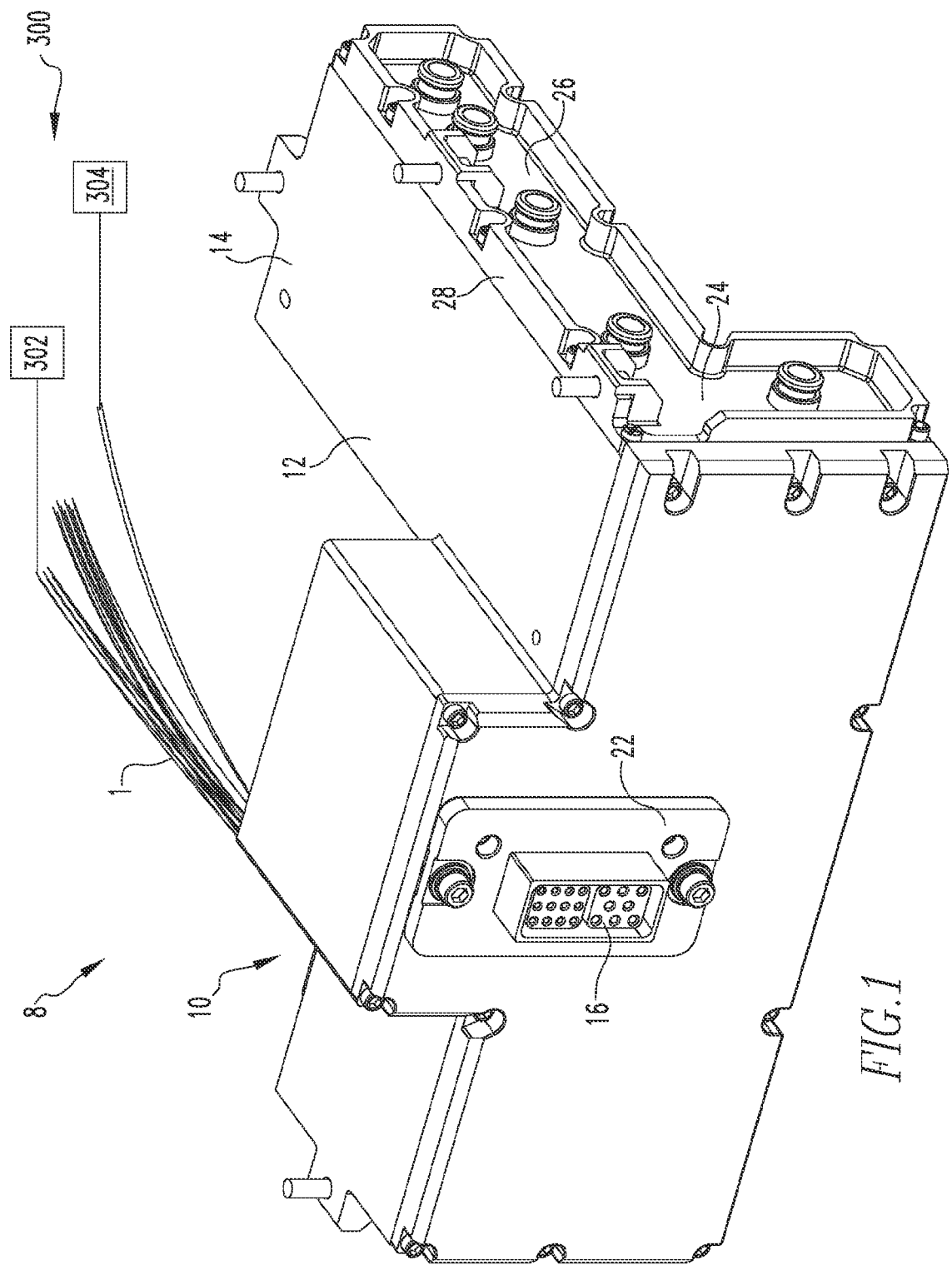
FIG. 1 is an isometric view of a power module in an electrical system.

It will be appreciated that the specific elements illustrated in the figures herein and described in the following specification are simply exemplary embodiments of the disclosed concept, which are provided as non-limiting examples solely for the purpose of illustration. Therefore, specific dimensions, orientations and other physical characteristics related to the embodiments disclosed herein are not to be considered limiting on the scope of the disclosed concept.

Directional phrases used herein, such as, for example, clockwise, counterclockwise, left, right, top, bottom, upwards, downwards and derivatives thereof, relate to the orientation of the elements shown in the drawings and are not limiting upon the claims unless expressly recited therein.

As used herein, the singular form of "a," "an," and "the" include plural references unless the context clearly dictates otherwise.

As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other. Accordingly, when two elements are coupled, all portions of those elements are coupled. A description, however, of a specific portion of a first element being coupled to a second element, e.g., an axle first end being coupled to a first wheel, means that the specific portion of the first element is disposed closer to the second element than the other portions thereof.

As used herein, the statement that two or more parts or components "engage" one another shall mean that the elements exert a force or bias against one another either directly or through one or more intermediate elements or components.

As used herein, the word "unitary" means a component is created as a single piece or unit. That is, a component that includes pieces that are created separately and then coupled together as a unit is not a "unitary" component or body.

As used herein, the term "number" shall mean one or an integer greater than one (i.e., a plurality).

As used herein, a "coupling assembly" includes two or more couplings or coupling components. The components of a coupling or coupling assembly are generally not part of the same element or other component. As such the components of a "coupling assembly" may not be described at the same time in the following description.

As used herein, a "coupling" or "coupling component(s)" is one or more component(s) of a coupling assembly. That is, a coupling assembly includes at least two components that are structured to be coupled together. It is understood that the components of a coupling assembly are compatible with each other. For example, in a coupling assembly, if one coupling component is a snap socket, the other coupling component is a snap plug, or, if one coupling component is a bolt, then the other coupling component is a nut.

As used herein, "associated" means that the elements are part of the same assembly and/or operate together, or, act upon/with each other in some manner. For example, an automobile has four tires and four hub caps. While all the elements are coupled as part of the automobile, it is understood that each hubcap is "associated" with a specific tire.

As used herein, "correspond" indicates that two structural components are sized and shaped to be similar to each other and may be coupled with a minimum amount of friction. Thus, an opening which "corresponds" to a member is sized slightly larger than the member so that the member may pass through the opening with a minimum amount of friction. This definition is modified if the two components are said to fit "snugly" together or "snuggly correspond." In that situation, the difference between the size of the components is even smaller whereby the amount of friction increases. If the element defining the opening and/or the component inserted into the opening are made from a deformable or compressible material, the opening may even be slightly smaller than the component being inserted into the opening. This definition is further modified if the two components are said to "substantially correspond." "Substantially correspond" means that the size of the opening is very close to the size of the element inserted therein; that is, not so close as to cause substantial friction, as with a snug fit, but with more contact and friction than a "corresponding fit," i.e., a "slightly larger" fit.

As used herein, "structured to [verb]" means that the identified element or assembly has a structure that is shaped, sized, disposed, coupled and/or configured to perform the identified verb. For example, a member that is "structured to move" is movably coupled to another element and includes elements that cause the member to move or the member is otherwise configured to move in response to other elements or assemblies.

As used herein, a "feeder layer" is a construct including a generally planar, non-conductive body with a number of conductive buses disposed therein. Such embedded conductive buses are protected and are resistant to wear and tear from vibration and other forces. The "feeder layer" further includes a number of conductive coupling components that are in electrical communication with the conductive bus(es). The conductive coupling components include, but are not limited to, a conductive pin that extends through, and generally perpendicular to, the non-conductive body, or, a passage that extends through, and generally perpendicular to, the non-conductive body as well as the conductive bus(es).

Figure 4:
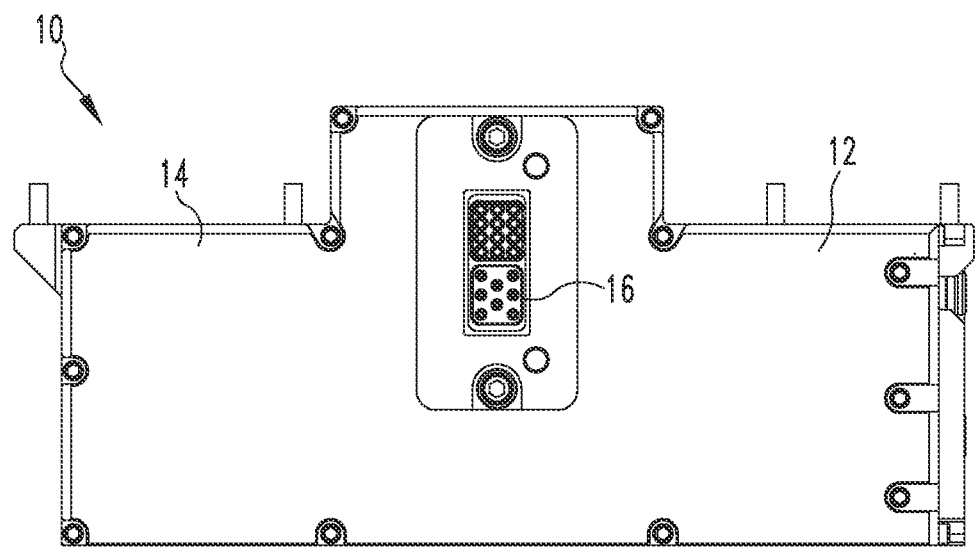
FIG. 4 is a front view of a power module.
Figure 5:
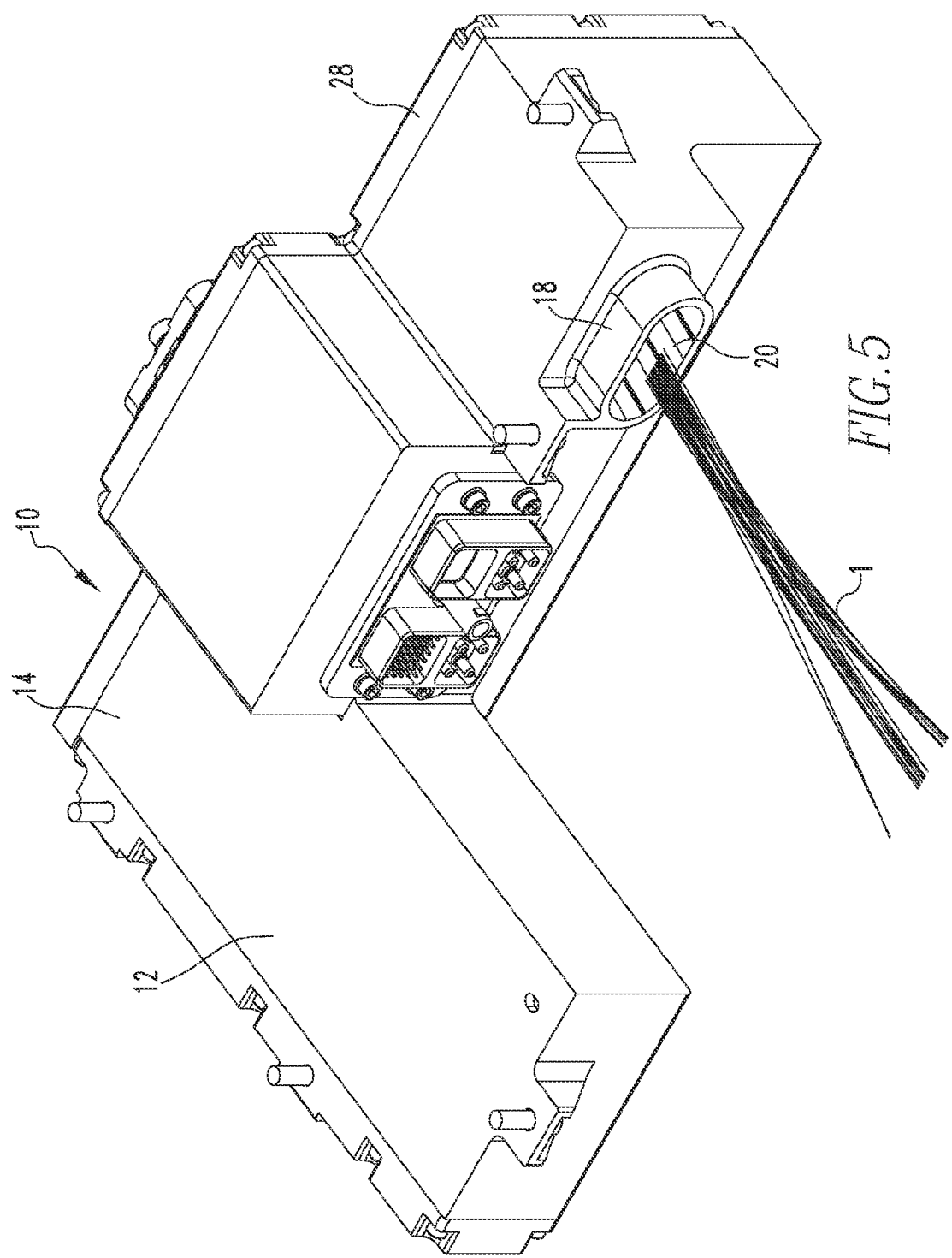
FIG. 5 is another isometric view of a power module.
Figure 6:
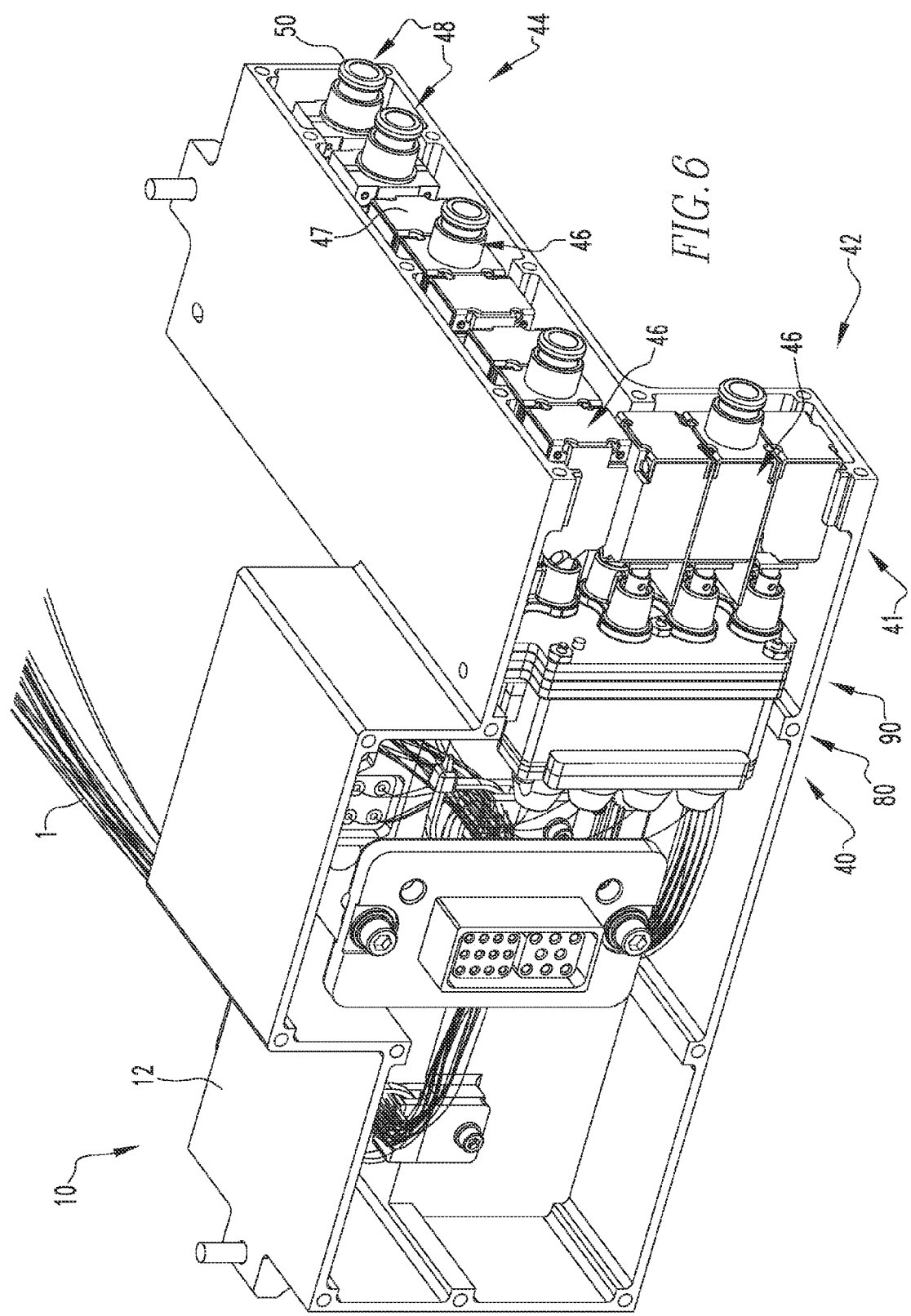
FIG. 6 is another isometric view of a power module with selected housing assembly sidewalls removed.

As shown in FIG. 1, an electrical system 8 includes a power module 10. As shown in FIGS. 1-5, the power module 10 includes a housing assembly 12 as well as an electrical assembly 40 (FIG. 6). The housing assembly 12 includes a number of generally planar sidewalls 14 and defines an enclosed space 15. In an exemplary embodiment, the sidewalls 14 are made from aluminum or titanium. In this configuration, the housing assembly 12 acts as a load bearing unit. That is, as used herein, a "load bearing unit" is an element that is capable of supporting a load of 150 lbs or more, and which is coupled to other elements so as to transfer a significant load. It is noted that, as used herein, a power module utilizing a flexible harness does not transfer a significant load.

The housing assembly 12 also includes a number of electrical ports 16. In an exemplary embodiment, each electrical port 16 includes a collar 18 extending about an electrical coupling component. If the electrical coupling is between wires 1 and the electrical port 16, as shown in FIG. 5, then the space defined by the collar 18 is, in an exemplary embodiment, filled with an epoxy 20. The epoxy 20 reduces the strain on the wires 1. As shown in FIG. 4, an electrical port 16 includes a support plate 22. The support plate 22 supports side loading. That is, the support plate 22 includes a flange about the electrical port 16 as well as bearings/holes to accept mating with another unit, such as but not limited to an ECU.

Figure 2:
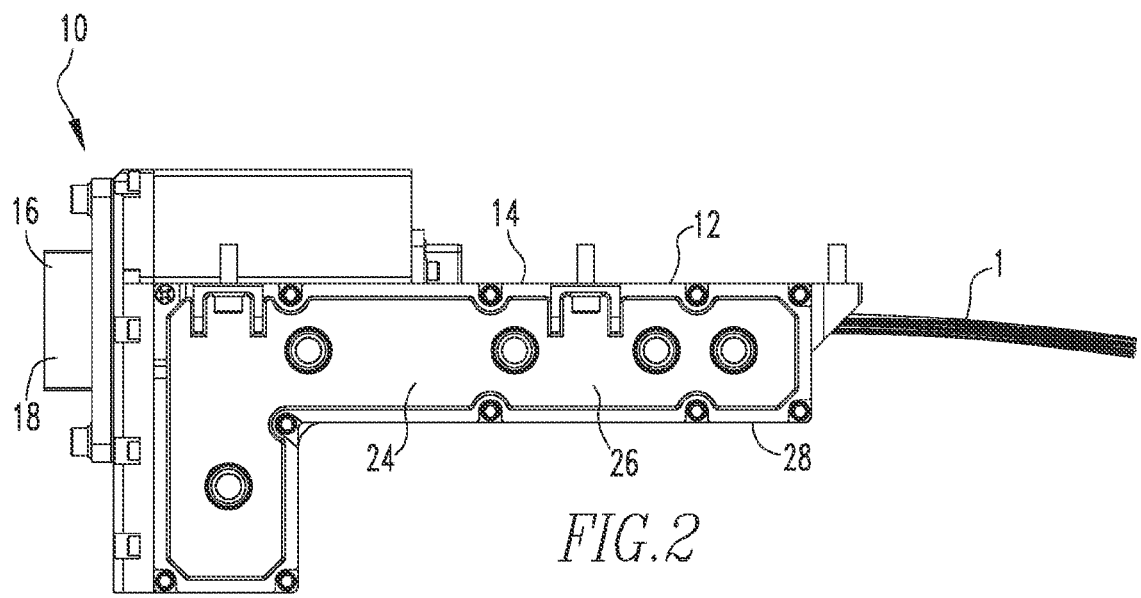
FIG. 2 is a side view of a power module.
Figure 3:
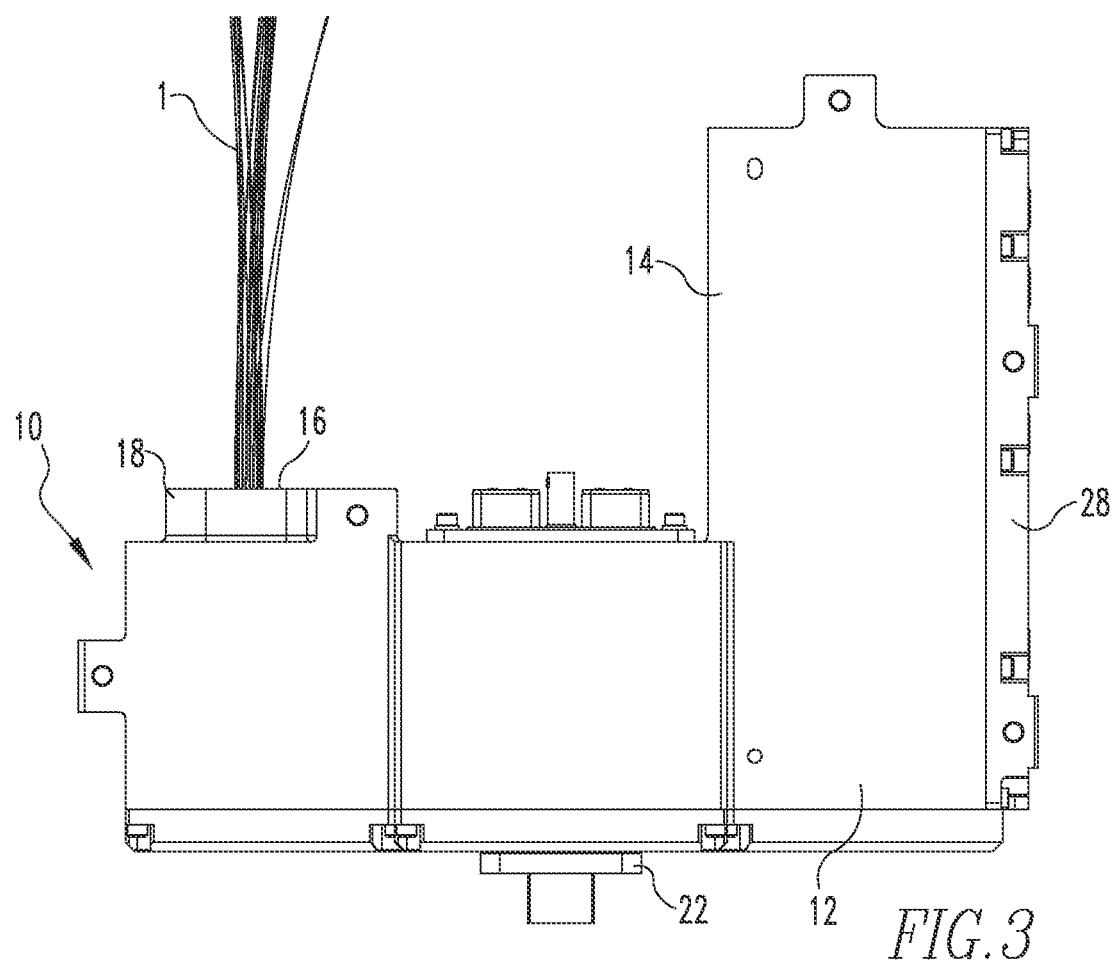
FIG. 3 is a top view of a power module.

Further, the housing assembly 12 also includes a selectively coupled, i.e. removable, face plate 24 (FIGS. 1 and 2). The face plate 24 is a generally planar member 26 including a number of openings (not shown) that, in an exemplary embodiment, correspond to circuit breaker actuator buttons 50. The face plate 24 further includes a generally perpendicular flange 28 extending thereabout. The face plate flange 28 further enhances the rigidity of the housing assembly 12 and, effectively, makes the face plate 24 a recessed face plate 24. In this configuration, the circuit breaker actuator buttons 50 are protected.

Figure 7:
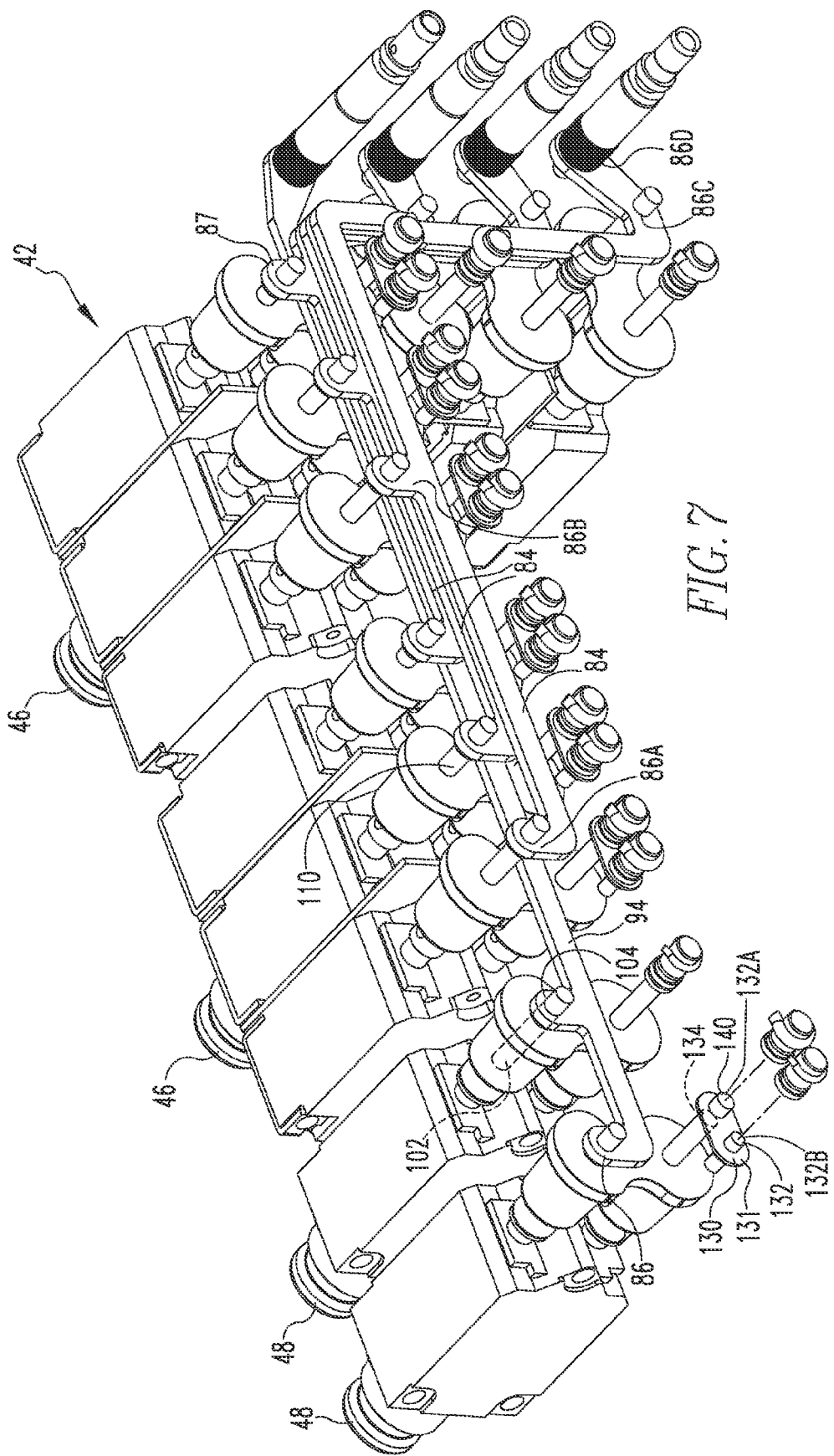
FIG. 7 is a partial isometric view of an electrical assembly.
Figure 8:
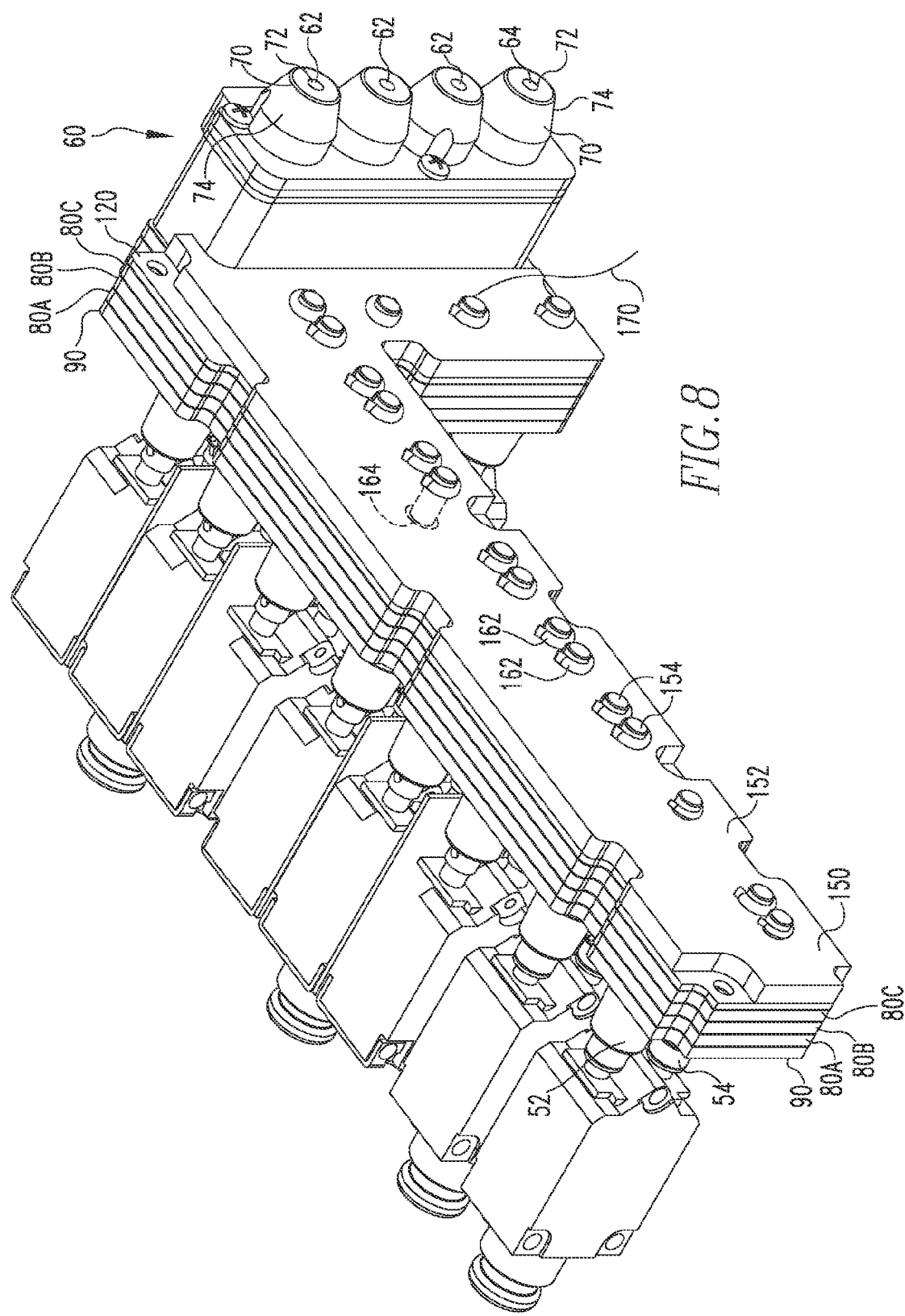
FIG. 8 is another partial isometric view of an electrical assembly.
Figure 9:
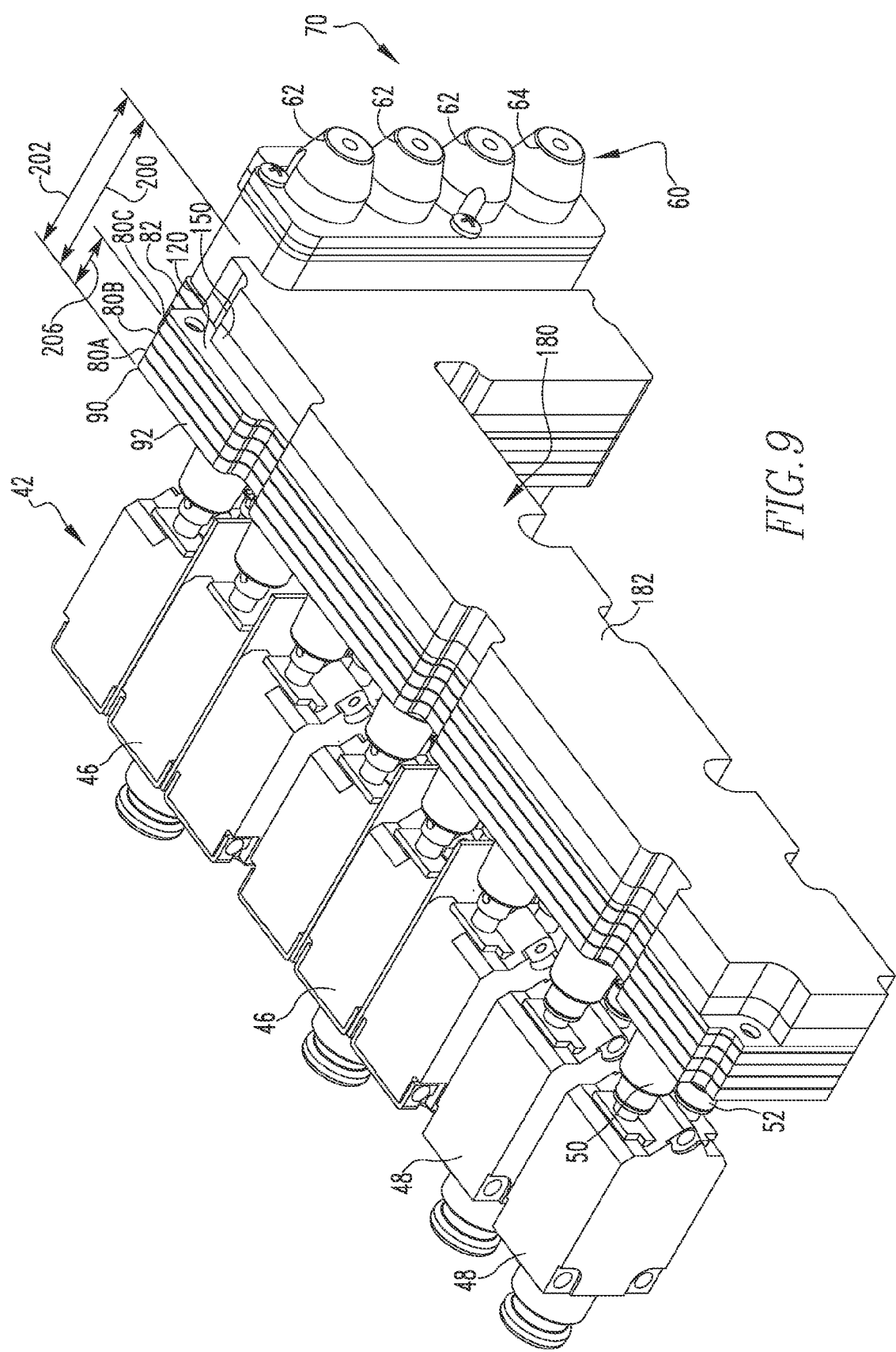
FIG. 9 is another partial isometric view of an electrical assembly.
Figure 10:
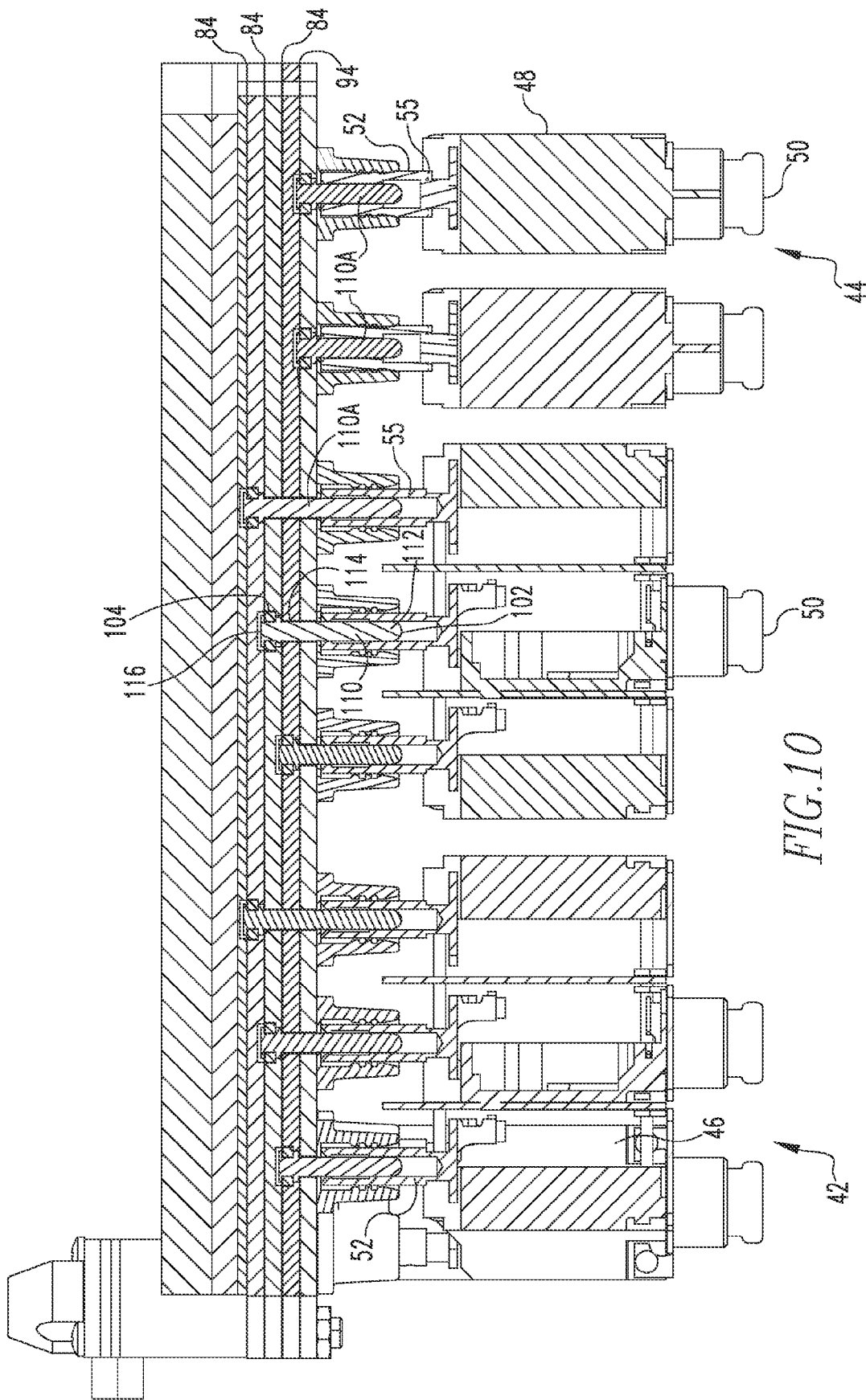
FIG. 10 is another partial isometric view of an electrical assembly showing the conductive elements.

As shown in FIGS. 6-10, the electrical assembly 40 includes a number of electrical components 41, an input assembly 60, a number of AC feeder layers 80, a number of DC feeder layers 90, and a number of conductive coupling components 100. The number of electrical components 41 includes a number of AC electrical components 42 and a number of DC electrical components 44. In an exemplary embodiment, the AC electrical components 42 and the DC electrical components 44 include a number of miniature circuit breakers 46, 48 respectively. Circuit breakers 46 are AC circuit breakers and circuit breakers 48 are DC circuit breakers. As is known, the circuit breakers 46, 48 include an actuator button 50, an operating mechanism and trip assembly (neither shown) as well as a number of line and load conductive coupling components 52, 54 (respectively) (FIGS. 8-10). In an exemplary embodiment, the circuit breaker conductive coupling components 52, 54 are sockets and, in an exemplary embodiment as shown, each circuit breaker includes a line socket 55 (FIG. 10) and a load socket (not shown). Further, in an exemplary embodiment, the AC circuit breakers 46 are three phase circuit breakers that include a line socket and a load socket for each phase. That is, each AC circuit breaker 46 includes three line sockets and three load sockets.

As shown in FIG. 7-9, the input assembly 60, in an exemplary embodiment, includes an AC input assembly 62 and a DC input assembly 64. Each of the AC input assembly 62 and the DC input assembly 64 include a number of input ports 70 which are substantially similar and only one will be described. An input port 70 includes two conductive coupling components. That is, each input port 70 includes an elongated conductor (not shown) including a first end (not shown) and a second end (not shown). The input port first end defines a socket 72 and the input port second end is a pin. The input port first end is, in an exemplary embodiment, disposed within a non-conductive collar 74.

As shown in FIGS. 7 and 9, each AC feeder layer 80 is substantially similar and are described generally. An AC feeder layer 80 includes a generally planar body 82 (FIG. 9) and an embedded conductor 84 (FIG. 7). The AC feeder layer body 82 is non-conductive. The AC feeder layer body 82 has a thickness of between about 0.040 inch and 0.080 inch or about 0.060 inch. The AC feeder layer embedded conductor 84 is elongated and includes a number of conductive coupling components 86A, 86B, 86C, 86D (or generally reference number 86). In an exemplary embodiment, a conductive coupling component 86 is an opening in a tab 87 offset from the longitudinal axis of the embedded conductor 84. In an exemplary embodiment, each AC feeder layer conductive coupling component 86A, 86B, 86C, 86D is an opening that corresponds to another conductive coupling component. For example, as shown, one AC feeder layer conductive coupling component 86A corresponds to an input port second end pin. Thus, when an input port second end pin is disposed in the AC feeder layer conductive coupling component 86A, the input port 70 is coupled to, and in electrical communication with, the AC feeder layer embedded conductor 84. It is noted that the shape of the AC feeder layer embedded conductor 84 and the locations of the AC feeder layer conductive coupling component 86A, 86B, 86C, 86D are configured to correspond to the number of AC electrical components 42 that are coupled thereto. As noted above, in an exemplary embodiment, the AC circuit breakers 46 are three phase circuit breakers. Accordingly, there are three AC feeder layers 80; a first AC feeder layer 80A, a second AC feeder layer 80B, and a third AC feeder layer 80C. Each of the AC feeder layer bodies 82 have a substantially similar shape. As shown, the shape of the AC feeder layer bodies 82 is generally "L" shaped.

Each DC feeder layer 90 is substantially similar and are described generally. A DC feeder layer 90 includes a generally planar body 92 and an embedded conductor 94. The DC feeder layer body 92 is non-conductive. The DC feeder layer body 92 has a thickness of between about 0.040 inch and 0.080 inch or about 0.060 inch. The DC feeder layer embedded conductor 94 is elongated and includes a number of conductive coupling components (not shown). As with the AC feeder layer embedded conductor 84, the DC feeder layer embedded conductor 94 conductive coupling components are, in an exemplary embodiment, openings that correspond to another conductive coupling component. In an exemplary embodiment, there is a single DC feeder layer 90A. The DC feeder layer body 92 has a shape that substantially corresponds to the shape of the AC feeder layer bodies 82.

The electrical assembly number of conductive coupling components 100 includes external coupling components 102 and internal coupling components 104. The external coupling components 102 are structured to have electrical components 42, such as, but not limited to, miniature circuit breakers 46, 48 coupled thereto. The external coupling components 102 are generally the same and only one will be described. In an exemplary embodiment, the conductive coupling components 100 are elongated pins 110 that include a first end 112, a medial portion 114 and a second end 116. The pins 110 are oriented so that the longitudinal axis thereof extends generally perpendicular to the plane of the AC and the DC feeder layer bodies 82, 92. The external coupling components 102 are disposed at the pin first ends 112.

That is, in an exemplary embodiment, as shown in FIG. 10, each external coupling component 102 is a pin first end 112 that corresponds to a circuit breaker socket. Further, for each circuit breaker 46, 48 there is a load pin 110A and a line pin 110B corresponding to each circuit breaker line socket and load socket. Thus, each external coupling component 102, i.e. each pin first end 112, is structured to be, and is, coupled to and in electric communication with either an AC electrical component 42 or a DC electrical component 44.

The internal coupling components 104 include both the pin medial portions 114 and the pin second ends 116. For example, each pin medial portion 114 corresponds to an AC or DC feeder layer conductive coupling component 86. That is, in an exemplary embodiment, each pin medial portion 114 substantially corresponds, or snuggly corresponds, to the size of the AC or DC feeder layer conductive coupling component 86. Each pin medial portion 114 extends through, and is electrical communication with, the associated AC or DC feeder layer conductive coupling component 86, i.e. the "associated" AC or DC feeder layer conductive coupling component 86 is the AC or DC feeder layer conductive coupling component 86 through with the external coupling component pin medial portion 114 extends. In an exemplary embodiment, each pin second end 116 extends through the various AC and the DC feeder layer bodies 82, 92 and is coupled to a splitter element second coupling component, as discussed below. In another exemplary embodiment, not shown, each pin second end 116 extends through the various AC and the DC feeder layer bodies 82, 92 and forms a terminal similar to the terminal elements 154 discussed below.

In an exemplary embodiment, as shown in FIGS. 7 and 9, the electrical assembly 40 further includes a number of splitter layers 120. Each splitter layer 120 includes a body 122 (FIG. 9) and a number of splitter elements 124 (FIG. 7). The splitter layer body 122 has a thickness of between about 0.040 inch and 0.080 inch or about 0.060 inch. The splitter layer body 122 has a shape that substantially corresponds to the shape of the AC feeder layer bodies 82. Each splitter element 124 includes a conductive body 130. Each splitter element body 130 includes a generally planar member 131, plurality of conductive first coupling components 132 and a single conductive second coupling component 134. In an exemplary embodiment, the splitter element body second coupling component 134 is a socket (not shown) that corresponds to a pin second end 116. Thus, when a splitter layer body 122 is stacked on the AC and the DC feeder layer bodies 82, 92, a pin second end 116 is disposed in, and in electrical communication with, the splitter element body second coupling component 134. In an exemplary embodiment, each splitter element body first coupling component 132 is a lug 140 extending from the splitter element body planar member 131 on a side of the splitter element body planar member 131 opposite the splitter element body second coupling component 134. In an exemplary embodiment, there are two splitter element body first coupling components 132; a primary first coupling component 132A and a secondary first coupling component 132B. The primary first coupling component 132A and the secondary first coupling component 132B are in electric communication with each other. In an exemplary embodiment, not shown, each splitter element body first coupling component 132 is a terminal as described below. Further, as shown, the splitter layer body 122, in an exemplary embodiment, also includes a number of passages that allow a pin second end 116 to extend therethrough.

In an exemplary embodiment, and as shown in FIG. 8, the electrical assembly 40 further includes a number of terminal layers 150. In an exemplary embodiment, there is one terminal layer 150. The terminal layer 150 includes a body 152 and a number of terminal elements 154. The terminal layer body 152 has a thickness of between about 0.040 inch and 0.080 inch or about 0.060 inch. The terminal layer body 152 has a shape that substantially corresponds to the shape of the AC feeder layer bodies 82. The terminal elements 154 include conductive bodies 160 that extend through the terminal layer body 152. The terminal element bodies each include a conductive first coupling component 162 and a conductive second coupling component 164, hereinafter "terminal element conductive first coupling component 162" and "terminal element conductive second coupling component 164." As shown, in an exemplary embodiment, the terminal element conductive first coupling component 162 is a generally circular terminal 166 about which a wire 170 may be wrapped. The terminal element conductive second coupling component 164, in an exemplary embodiment, is a socket sized to correspond to a splitter body lug 140.

In an exemplary embodiment, the electrical assembly 40 further includes a cover layer 180, as shown in FIG. 9. The cover layer 180 includes a body 152. The cover layer body 152 is substantially hollow and open on one planar side. The cover layer body 152 has a thickness of between about 0.040 inch and 0.080 inch or about 0.060 inch. The cover layer body 182 has a shape that substantially corresponds to the shape of the AC feeder layer bodies 82. The cover layer 180 is structured to enclose the wires 170 coupled to the terminal layer 150

The various layers discussed above are assembled in a stack 200. That is, as used herein a "stack" is a number of generally planar elements disposed with the planes substantially parallel to each other and with each element disposed adjacent another element. The "stack" may include other elements such as, but not limited to coatings or adhesives. In an exemplary embodiment, the stack 200 is a direct contact stack 202 wherein, as used herein, a "direct contact stack" is a number of generally planar elements disposed with the planes substantially parallel to each other and with each element disposed immediately adjacent another element and directly coupled thereto. In either a stack 200 or a direct contact stack 202 the measurement of the thickness does not include the perpendicular conductive coupling components 100.

As shown in FIG. 9, a conductive stack 206 includes only the AC feeder layers 80 and the DC feeder layers 90. In an exemplary embodiment, as noted above, there are three AC feeder layers 80A, 80B, and 80C and a single DC feeder layer 90A. The conductive stack 206 has a thickness of between about 0.250 inch and 0.320 inch or about 0.285 inch. The conductive stack 206 is either a stack 200 or a direct contact stack 202.

A stack that includes layers other than the AC feeder layers 80 and the DC feeder layers 90 is identified by the broader, general term stack 200, or direct contact stack 202, as defined above. In an exemplary embodiment, a stack 200, or direct contact stack 202, includes the AC feeder layers 80, the DC feeder layers 90, the splitter layers 120, the terminal layers 150, and the cover layer 180. In an exemplary embodiment, as noted above, there are three AC feeder layers 80A, 80B, and 80C and a single DC feeder layer 90A as well as a single splitter layer 120, a single terminal layer 150 and a single cover layer 180. The stack 200, or direct contact stack 202, has a thickness of between about 0.250 inch and 0.620 inch or about 0.435 inch.

The electrical system 8 includes a number of other electrical devices 300 (shown schematically). In use, the power module 10 is coupled to, and in electrical communication with, such electrical devices 300. A number of the electrical devices 300 are alternate use devices 302, 304. That is, as used herein, an "alternate use device" is one of a set of devices 300 wherein only one device 300 in the set is used at a time. As a non-limiting example, the alternate use devices 302, 304 are a first fuel pump and a second fuel pump. In operation, only one fuel pump is used at a time. In this configuration, the alternate use devices 302, 304, in an exemplary embodiment, share a single circuit breaker, e.g. an AC circuit breaker 46. The alternate use devices 302, 304 are coupled to, and in electrical communication with, an associated circuit breaker 46 or 48 via a splitter element 124. That is, a first alternate use device 302 is coupled to, and in electrical communication with, the primary first coupling component 132A, and, a second alternate use device 304 is coupled to, and in electrical communication with, the secondary first coupling component 132B. In view of the electric coupling described above, this means that, the first alternate use device 302 is coupled to a first circuit breaker 47 and the second alternate use device 304 is coupled to, and in electrical communication with, the first circuit breaker 47. In an exemplary embodiment, the selection of which alternate use device 302, 304 is in use occurs at a different control module. Stated alternatively, a number of the electrical components 41 are structured to be coupled to, and in electrical communication with, the first alternate use device 302 and the second alternate use device 304. Thus, by allowing alternate use devices 302, 304 to share a single circuit breaker 46, 48, the total number of circuit breakers 46, 48 is reduced. That is, by joining the load points on individual circuit breakers 46, 48, multiple loads can be powered from the same source, or, multiple loads can be powered from multiple sources, and more circuits can be protected with reduced number of circuit breakers 46, 48 by controlling the loads with a controller (not shown).

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A power module comprising:
a housing assembly defining an enclosed space;
an electrical assembly including an AC input assembly, a DC input assembly, a number of AC feeder layers, a number of DC feeder layers, and a number of electrical components;
said number of electrical components includes a number of AC electrical components and a number of DC electrical components;
each AC feeder layer including a generally planar body that is non-conductive and an embedded conductor, the embedded conductor of each of the AC feeder layers being embedded in the generally planar body of the respective AC feeder layer;
each DC feeder layer including a generally planar body that is non-conductive and an embedded conductor, the embedded conductor of each of the DC feeder layers being embedded in the generally planar body of the respective DC feeder layer;
each AC feeder layer conductor coupled to, and in electrical communication with, said AC input assembly;
each DC feeder layer conductor coupled to, and in electrical communication with, said DC input assembly;
each AC electrical component coupled to, and in electrical communication with, an AC feeder layer conductor; and
each DC electrical component coupled to, and in electrical communication with, a DC feeder layer conductor, wherein
said number of AC feeder layers includes a first AC feeder layer, a second AC feeder layer, and a third AC feeder layer;
said number of DC feeder layers includes a single DC feeder layer; and
the first AC feeder layer, the second AC feeder layer, the third AC feeder layer, and the single DC feeder layer are disposed in a direct contact stack such that the generally planar bodies of the AC and the DC feeder layers directly contact one another.

2. The power module of claim 1 wherein said direct contact stack has a thickness of between about 0.250 inch and 0.620 inch.

3. The power module of claim 2 wherein said direct contact stack has a thickness of about 0.435 inch.

4. The power module of claim 1 wherein:
said electrical assembly includes a splitter layer;
said splitter layer including a number of splitter elements, each said splitter element disposed in said splitter layer, each splitter element including a plurality of conductive first coupling components; and
each said splitter element in electrical communication with one of said AC electrical components or one of said DC electrical components.

5. The power module of claim 4 wherein:
each said plurality of splitter element first coupling components includes a primary first coupling component and a secondary first coupling component; and
wherein each said primary first coupling component and an associated splitter element secondary first coupling component are in electrical communication.

6. The power module of claim 5 wherein:
said electrical assembly includes a terminal layer, said terminal layer including a generally planar body and a number of terminal elements;
each said terminal layer terminal element including a conductive second coupling component and a terminal; and
each said terminal element conductive second coupling component coupled to, and in electrical communication with, one of an associated said primary first coupling component or said secondary first coupling component.

7. The power module of claim 4 wherein a number of said electrical components are structured to be coupled to, and in electrical communication with, a first alternate use device and a second alternate use device.

8. The power module of claim 1 wherein said housing assembly is a load bearing unit.

9. The power module of claim 8 wherein:
said housing assembly includes a faceplate; and
said faceplate including a generally planar member and a generally perpendicular flange extending thereabout.

10. An electrical system comprising:
a first alternate use device;
a second alternate use device;
a power module including a housing assembly and an electrical assembly;
said housing assembly defining an enclosed space;
said electrical assembly including an AC input assembly, a DC input assembly, a number of AC feeder layers, a number of DC feeder layers, and a number of electrical components;
said number of electrical components includes a number of AC electrical components and a number of DC electrical components;
each AC feeder layer including a generally planar body that is non-conductive and an embedded conductor, the embedded conductor of each of the AC feeder layers being embedded in the generally planar body of the respective AC feeder layer;
each DC feeder layer including a generally planar body that is non-conductive and an embedded conductor, the embedded conductor of each of the DC feeder layers being embedded in the generally planar body of the respective DC feeder layer;
each AC feeder layer conductor coupled to, and in electrical communication with, said AC input assembly;
each DC feeder layer conductor coupled to, and in electrical communication with, said DC input assembly;
each AC electrical component coupled to, and in electrical communication with, an AC feeder layer conductor;
each DC electrical component coupled to, and in electrical communication with, a DC feeder layer conductor;
said number of DC electrical components includes a first circuit breaker;
said first alternate use device coupled to, and in electrical communication with, said first circuit breaker; and
said second alternate use device coupled to, and in electrical communication with, said first circuit breaker, wherein
said number of AC feeder layers includes a first AC feeder layer, a second AC feeder layer, and a third AC feeder layer;
said number of DC feeder layers includes a single DC feeder layer; and
the first AC feeder layer, the second AC feeder layer, the third AC feeder layer, and the single DC feeder layer are disposed in a direct contact stack such that the generally planar bodies of the AC and the DC feeder layers directly contact one another.

11. The electrical system of claim 10 wherein said direct contact stack has a thickness of between about 0.250 inch and 0.620 inch.

12. The electrical system of claim 11 wherein said direct contact stack has a thickness of about 0.435 inch.

13. The electrical system of claim 10 wherein:
said electrical assembly includes a splitter layer;
said splitter layer including a number of splitter elements, each said splitter element disposed in said splitter layer, each splitter element including a plurality of conductive first coupling components; and
each said splitter element in electrical communication with one of said AC electrical components or one of said DC electrical components.

14. The electrical system of claim 13 wherein:
each said plurality of splitter element first coupling components includes a primary first coupling component and a secondary first coupling component; and
wherein each said primary first coupling component and an associated splitter element secondary first coupling component are in electrical communication.

15. The electrical system of claim 14 wherein:
said electrical assembly includes a terminal layer, said terminal layer including a generally planar body and a number of terminal elements;
each said terminal layer terminal element including a conductive second coupling component and a terminal; and
each said terminal element conductive second coupling component coupled to, and in electrical communication with, one of an associated said primary first coupling component or said secondary first coupling component.

16. The electrical system of claim 13 wherein a number of said electrical components are structured to be coupled to, and in electrical communication with, a first alternate use device and a second alternate use device.

17. The electrical system of claim 10 wherein said housing assembly is a load bearing unit.

18. The electrical system of claim 17 wherein:
said housing assembly includes a faceplate; and
said faceplate including a generally planar member and a generally perpendicular flange extending thereabout.

* * * * *